United States Patent [19]
Witter et al.

[11] Patent Number: 4,547,258
[45] Date of Patent: Oct. 15, 1985

[54] DEPOSITION OF SILICON AT TEMPERATURES ABOVE ITS MELTING POINT

[75] Inventors: David E. Witter, Richardson; Mohendra S. Bawa, Plano, both of Tex.

[73] Assignee: Texas Instruments Incorporated, Dallas, Tex.

[21] Appl. No.: 452,173

[22] Filed: Dec. 22, 1982

[51] Int. Cl.$^4$ ............................................ C30B 15/04
[52] U.S. Cl. ................... 156/605; 156/610; 156/617 SP; 423/349
[58] Field of Search .................. 156/608, 617 SP, 613, 156/DIG. 64, DIG. 89, 605; 427/213, 94; 423/349; 422/139, 140

[56] References Cited

U.S. PATENT DOCUMENTS

| | | | |
|---|---|---|---|
| 4,242,697 | 12/1980 | Berthold et al. | 357/49 |
| 4,246,249 | 1/1981 | Dawless | 156/DIG. 64 |
| 4,282,184 | 8/1981 | Fiegl et al. | 156/DIG. 89 |
| 4,314,525 | 2/1982 | Hsu et al. | 427/213 X |
| 4,353,875 | 10/1982 | Yancey | 422/249 |

OTHER PUBLICATIONS

"Crystal Growth", Second Edition, edited, by Brian R. Pamplin, Pergamon Press, 198, pp. 172-174.
Bawa et al., "Hydrogen Reduction of Chlorosilanes" SC Engineering Journal Winter 1980, pp. 42-45.
Jewett et al., "Low-Cost Solar Array Project Task I-Silicon Material Gaseous Melt Replenishment System" DOE/JPL/955269-80/6, Energy Materials Corporation, Harvard, MA.

Primary Examiner—Hiram H. Bernstein
Assistant Examiner—John Donofrio
Attorney, Agent, or Firm—Carlton Hoel; Robert Groover; James Comfort

[57] ABSTRACT

Liquid silicon is deposited on a high surface area column of silicon nitride particles, by hydrogen decomposition of trichlorosilane. This is accomplished in an environment heated to a temperature in excess of the melting point of silicon. After deposition, the liquid silicon flows by gravity to a collection point. Preferably a liquid transfer system moves the silicon directly to a crystal pulling operation. The liquid transfer to immediate pulling conserves energy and allows for continual withdrawal of melt from the reactor. The immediate pulling provides additional purification and the crystal thus pulled is preferably used as feedstock for a final crystal pulling operation.

14 Claims, 1 Drawing Figure

DEPOSITION OF SILICON AT TEMPERATURES ABOVE ITS MELTING POINT

BACKGROUND AND SUMMARY OF THE INVENTION

The present invention relates to preparation of semiconductor-grade silicon.

The large crystals of silicon, from which the wafers used in integrated circuit device fabrication are cut, are grown from a silicon melt, and, while the crystal which is pulled from the melt is normally substantially purer than the melt itself, it is still necessary to have an extremely high-purity starting stock of silicon for the melt, in order to pull crystals having the extremely low impurity concentrations required for integrated circuit device fabrication. The present invention teaches an improved process for providing the silicon starting stock from which crystals are grown.

Normally, metallurgical-grade silicon, such as may be produced by direct reaction of coke and silica in a furnace, is reacted with HCl at 300° C. to form trichlorosilane. This first step of processing leaves behind much of the impurity in metallurgical silicon. The trichlorosilane itself can be filtered and redistilled, to further refine its impurity. The trichlorosilane is then reduced to form elemental silicon of reasonably high purity. It is of course possible to use other silicon compounds for the reaction which deposits silicon, and the present invention is applicable generally to processes in which silicon is deposited from a gas-phase reaction.

Conventionally, the deposition of silicon from the gaseous phase can be accomplished as disclosed, for example, in U.S. Pat. No. 4,213,937, which teaches a fluidized bed reactor for deposition of silicon. An alternative process is the so-called "Siemens" process, which involves hydrogen reduction of chlorosilanes on an electrically heated silicon filament. A third known process for preparation of silicon (the Union Carbide process) yields very finely divided (almost colloidal) silicon, produced by a free-space reaction.

The present invention provides a new and different process for deposition of silicon from a gas-phase reaction. The present invention deposits silicon as a liquid rather than as a solid, i.e. the deposition zone is held above the melting point of silicon (1410° C.). While deposition of silicon above its melting point has been previously described in the published literature (see M. Bawa, "Hydrogen Reduction of Chlorosilanes", *Semiconductor Engineering Journal*, Vol. 1, No. 3, page 42 (1980)), the present invention teaches at least two features of a liquid-silicon deposition process which are not taught or suggested by the Bawa article. The present invention deposits silicon above its melting point on a bed of silicon nitride particles having a high total surface area. Since silicon nitride is wetted by silicon, the silicon drips down through the silicon nitride particle bed, and can be collected at the bottom of the reactor. The previous technology regarding deposition of silicon above its melting point was not commercially exploited, because of the lack of suitable materials for configuration of such a reactor. However, the present invention teaches using a silicon nitride reactor, which may contain all nitride parts formed by the process taught in simultaneously-filed application No. 452,484.

Thus it is an object of the present invention to provide a suitable process for deposition of silicon above its melting point.

Deposition of silicon above its melting point is desirable in part because the efficiency of reaction of the process gases is at a maximum very close to the melting point of silicon. Thus, a liquid-deposition process is inherently more efficient than a lower-temperature deposition process. The prior art processes typically achieve deposition at temperatures in the neighborhood of 1200° C.

A very important difficulty with growth of semiconductor-grade crystals when using prior art silicon-deposition processes such as the Siemens process or fluidized-bed technology is that the intermediate stage silicon, i.e. the polycrystalline silicon which is formed by the deposition process, must be handled and exposed to the atmosphere, and can absorb undesirable impurities while it remains in this intermediate stage.

A further object of the invention is therefore to provide a method for growth of crystals of semiconductor-grade silicon, which does not require handling of any intermediate stage of bulk silicon which has a large surface area.

A further difficulty of prior methods for preparing the feedstock for silicon crystal pullers is that they are not inherently well suited to small-scale production processses. Thus, the economies of scale involved in bulk polysilicon production tend to impose a barrier to entry which either precludes competition by smaller entry level enterprises or forces them to be dependent on supplies received from larger corporations.

Thus it is an object of the present invention to provide a method for provision of silicon feedstock to silicon crystal pullers which is inherently suitable for efficient small-scale operation.

A further important innovation feature of the invention is the provision for an intermediate crystal pulling step. That is, in the presently preferred embodiment, the liquid as-deposited silicon is directly transferred to a first crystal puller, from which a first rod of polycrystalline or crystalline silicon is pulled. Since impurity segregation occurs at this stage, the rod which is thus pulled is more pure than the liquid silicon from which it is pulled. In addition, the pulled rod itself has low surface area, and can therefore be handled and stored much more safely than large-surface-area forms of bulk silicon.

In one aspect of the invention, there is provided a means for the deposition of silicon, at a temperature above its melting point, on a large surface area column of silicon nitride. This arrangement permits gravity feed of the liquid silicon to a reservoir below the column. The reservoir is connected to a crystal puller apparatus to provide recharging capability to the crystal pulling operation.

The means for deposition preferably comprises a vessel of high purity silicon nitride, containing particles of silicon nitride. Trichlorosilane and hydrogen are introduced into the vessel containing the heated silicon nitride, where it is subjected to a hydrogen reduction process. This process results in deposition of liquid silicon on the silicon nitride particles. Gravity flow carries the liquid silicon to a reservoir, which is preferably connected with a crystal pulling apparatus. All of the items mentioned are fabricated of high purity silicon nitride, so that all the surfaces that come in contact with the liquid silicon are formed from high purity materials.

This removes these items from the list of possible sources of impurities.

In another aspect of the invention, there is provided a method for deposition of silicon on a silicon nitride matrix at a temperature above the melting point of silicon. The method begins with a vessel containing a column of high purity silicon nitride particles enclosed in a vessel of high purity silicon nitride. A reservoir to collect the liquid silicon, and connecting pipe to transfer molten silicon from the reservoir to a crystal pulling operation, are also made of high purity silicon nitride. All these parts are heated to ensure the silicon is maintained in a liquid state until a crystal is grown. Trichlorosilane and hydrogen is introduced into the column containing silicon nitride particles, and hydrogen reduction of the trichlorosilane takes place, with silicon being deposited on the large surface area of the silicon nitride particles. The liquid silicon is collected by gravity flow in a reservoir, and a liquid transfer system carries the silicon to the melt reservoir of a crystal pulling apparatus. A crystal rod is grown from the liquid, the rod having a very high purity.

According to the present invention there is provided: a process for producing silicon from a silicon bearing gas flow, comprising the steps of: providing a matrix of silicon nitride particles; forcing through a portion of said matrix of silicon nitride particles a stream of a silicon bearing gas mixture; said matrix of silicon nitride particles being heated to above the melting temperature of silicon while said gas flow is passed through said matrix; and collecting at the bottom of said matrix of silicon nitride particles liquid silicon deposited on said nitride particles from said gas stream.

A freezing valve for liquid silicon, in which an S trap is used to facilitate obstruction of the passageway by the frozen silicon, is disclosed in a report submitted by Energy Materials Corporation, of Harvard, Mass., to the U.S. Department of Energy under JPL Contract 955269, "gaseous Melt Replenishment System". The authors of this report are D. Jewett et al. A trap configuration for the freezing valve, such as disclosed in this publicly available report, is preferably used in practicing the present invention.

Liquid transfer of silicon, using quartz plumbing, is believed to have been exemplified in products marketed by Siltec Company for several years now.

BRIEF DESCRIPTION OF THE DRAWINGS

The present invention will be described with reference to the accompanying drawings, wherein:

The FIGURE shows an apparatus for deposition of liquid silicon on a high-surface-area silicon nitride matrix, collection and transfer of the silicon to an intermediate puller, and growth of a polysilicon rod.

DESCRIPTION OF THE PREFERRED EMBODIMENTS

Figure 1:
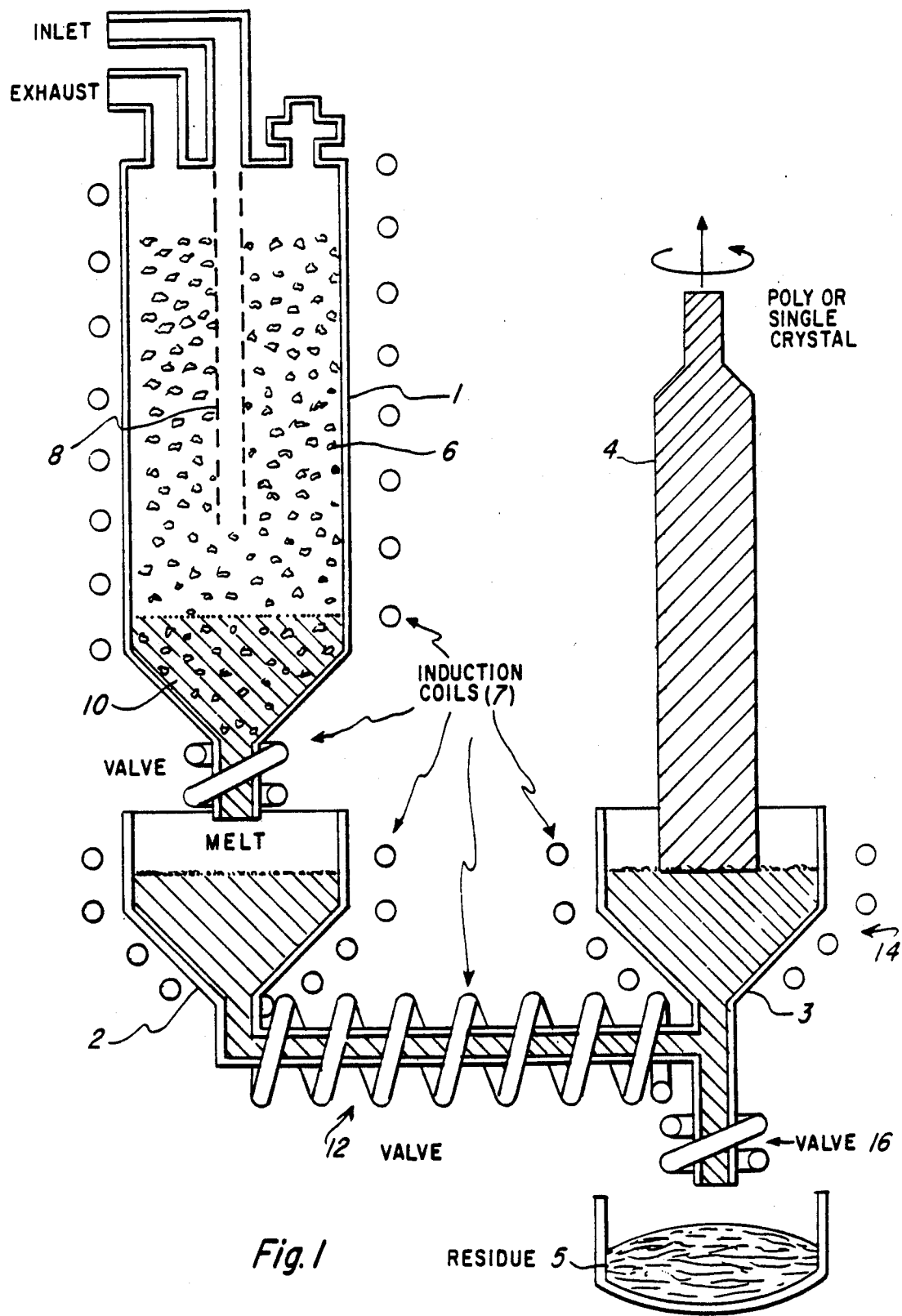

The appropriate material for containing the deposition of silicon above its melting point is silicon nitride. Nitride crucibles and plumbing are formed by the process disclosed in simultaneously-filed application No. 452,484, which is hereby incorporated by reference. Grown polysilicon rods will have better structural integrity than the CVD rods formed by the "SIEMENS" process.

Inside the nitride crucible is contained a matrix of nitride particles. A wide range of particle sizes may be used, since the choice of the optimum particle size affects the efficiency but does not affect the workability of the process. In the presently preferred embodiment, an average particle size of around 40 mils is used, but a wide range of other particle sizes, including sizes from less than 10 to greater than 300 mils, can be used. In the presently preferred embodiment, the nitride matrix is provided by directly nitrided nodules from a fluidized bed reactor process for deposition of silicon. These nodules are nitrided by conventional techniques (for example, heating at 1300° C. in an atmosphere of nitrogen or ammonia), for a time period which is dependent on the average particle diameter (e.g. greater than 20 hours for 40 mil particles). It should be noted that the particles must not be too small, or capilary effects will substantially reduce the exposed liquid surface area, and the net continuous gravity feed of silicon to the reservoir 2 at the bottom of a column will be reduced. Conversely, as the size of the particles becomes larger, the gross surface area of the nitride matrix is reduced. Preferably a perforated inlet pipe 8 is used to inject a reaction gas mixture into the center of the nitride matrix.

In the presently preferred embodiment, the reaction gas mixture used is 2 to 16% of trichlorosilane, with the remainder of the gas mixture being hydrogen. Hydrogen provides greater efficiency in the utilization of the trichlorosilane gas, but it is not strictly necessary to use a hydrogen reduction process. Alternatively, trichlorosilane or dichlorosilane, as well as other silanes, can simply be thermally decomposed to effect deposition of silicon. Of course, a wide variety of other process gases can also be used, including all of the chlorosilanes from $SiH_4$ to $SiCl_4$, as can other chlorosilicon compounds such as $Si_2Cl_6$ and others. As another example, 2 to 10% of silicon tetrachloride, with the remainder hydrogen, can also be used as an input gas stream.

The nitride matrix 6 is heated, preferably by induction coils 7, although a resistance heater may alternatively be used. Preferably the temperature of the nitride matrix is held in the neighborhood of 1450°, but it may be anywhere within the range above the melting point of silicon permitted by the decomposition properties of silicon nitride. Thus, the preferred range of temperatures is between 1410° C. and 1620° C. The pressure is preferably atmospheric or slightly over atmospheric (up to a few psi of positive pressure), although this parameter can be widely varied if desired. If it is desired to introduce oxygen into the melt at deposition, an overpressure of nitrous oxide can be introduced into the atmosphere over the melt.

Some gradual decomposition of the nitride matrix particles and crucible will be experienced during operation of the system. The process can optionally be modified in several ways to avoid problems caused by the nitride decomposition. First, the decomposition process is thermally sensitive, so that the temperature of deposition is preferably held to within about 10° of the melting point of silicon. Second, the nitride crucible and the matrix of nitride particles are both preferably made out of high-purity silicon nitride. This is because, when the nitride decomposes, it will evolve a gas and liquid silicon, and the liquid silicon will pass into the melt. Third, periodic chemical vapor deposition of silicon nitride can be used, to compensate for reduction in the section of the nitride parts. Thus, as is well known in the art, a gas mixture such as ammonia plus a silicon bearing gas (e.g. silane, trichlorosilane, or tetrachlorosilane) is flowed into the crucible at about 1200° to 1250° C., to deposit a nitride layer. This is preferable for the crucible itself, but, for the nitride matrix particles, the preferred method is simply to recharge the matrix with fresh particles, as the old ones are gradually reduced in size. CVD nitride deposition onto the matrix particles can be performed in a separate reactor, to avoid gradually cementing the nitride particles into a single mass. Of course, a short pre-etch step, e.g. with HCl, is preferably used before the nitride deposition. Fourth, as noted above, a high partial pressure of nitrogen can be maintained, although this is not expected to produce major advantage. Fifth, deposition temperature can be cycled. That is, deposition of silicon on the matrix is performed at a temperature just below the melting point (e.g. 20° below the melting point), and periodically the temperature of the matrix is ramped up, e.g. 50° in 10 or 15 minutes, to melt out the freshly deposited silicon. In this case, the advantages of liquid-state transport are retained, but the nitride parts are subjected to a smaller amount of time at high temperatures. The interval between melting cycles can be selected to determine the amount of liquid silicon which is freed in one melting cycle, but a convenient way to regulate this is to extend the deposition phase of the cycle long enough that each melting phase of the cycle provides approximately one puller charge.

Although the presently preferred embodiment uses a nitride component for the crucible 1 which contains the matrix of nitride particles, it is not strictly necessary that this crucible itself be composed of nitride. For example, it is possible that a graphite-supported silicon carbide crucible could be used. However, nitride is preferable, due to its hot strength properties, high purity, and complete lack of reactivity with regard to the silicon nitride particles of the matrix 6.

The liquid silicon which is deposited on the nitride matrix 6 flows by gravity down to the bottom area 10 of the crucible 1, and liquid silicon from this point is available for transfer either to an intermediate freezing step or to a liquid transfer and regrowth process, as will be described below.

If immediate freezing is desired, the liquid silicon collected in the bottom portion 10 of the crucible is simply allowed to drain out, for example into a second crucible of nitride, where the silicon is allowed to freeze. (The crucible in which the silicon freezes is of course itself preferably specially shaped, so that the expansion of the silicon upon freezing does not smash the crucible and permit the silicon to come in contact with environmental impurities.)

In the presently preferred embodiment, the melt collected from the nitride matrix is selectively transferred in the liquid state, as controlled by an induction valve 12, to an intermediate regrowth apparatus 14.

The induction valve applies a principle which has been used in conventional metal foundry work, but which is unfamiliar in the art of semiconductor materials. An induction coil is used to provide localized heating to a constricted passage, so that material is selectively thawed or frozen in the constricted passage. Note that, due to the expansion of silicon on freezing, this method is only practical if the materials used for the expansion passage are of quite high strength, such as silicon nitride. It should also be noted that silicon below about 900° C. does not couple well to induction heating, so that a torch or resistance heater is necessary in such cases to provide initial heating of a cold induction valve which has frozen when included material.

In a preferred embodiment, the liquid silicon is transferred to an intermediate puller apparatus 14. In this apparatus, a polycrystalline rod or a single crystal silicon rod is pulled from a melt 3, thus accomplishing additional purification of the silicon. This purification, as is well known in the art, is a consequence of the segregation of impurities which normally attends crystal growth. Since various undesirable impurities, such as Fe, Na, P, Cu, C, will be preferentially left behind in the melt rather than pulled out in the rod 4, the presently preferred embodiment uses an additional induction valve 16 to periodically dump the residue from the intermediate puller melt 3 into a residue disposal 5. It should also be noted that the rod 4, which is pulled by completely conventional techniques, can be pulled substantially faster than would be possible for a pure single crystal silicon bar. However, the faster the rod is pulled, the less beneficial segregation of impurities will occur.

In addition, the rod 4 need not be intrinsic silicon, but can be doped at this stage. For example, a small concentration of boron or of phosphorus can easily be added to the intermediate puller melt 3. In this case, the polycrystalline rod 4 will, as is well known in the art, be pulled with an impurity gradation along its length, due to the segregation effects. This impurity gradation along the rod is actually desirable for use as feedstock for a rechargeable puller.

A rechargeable crystal puller, such as, for example a Hamco model CG2000 RC, has provision for recharging the melt from which the crystal is pulled, by means of a recharge rod. Such a recharge rod is preferably in the form of a cylinder. For convenient handling especially at elevated temperatures, it is preferable that the recharge rods not have high internal stresses. By using a polycrystalline rod pulled according to the present invention, and cutting or breaking the rod up into pieces, a sequence of recharge rods for use in a rechargeable puller is achieved which introduces a graduated concentration of dopant. That is, where, as is commonly desired, a single crystal of silicon which is to be pulled which includes a heavy concentration of a dopant, the impurity segregation effects during crystal growth means that the concentration of boron in the melt will change as one or more crystals are pulled from the melt. Since the melt is disproportionately depleted as each successive crystal is pulled, the replenishment of the dopant in the melt should also be disproportionate, that is each successive quantity of bulk silicon added to the melt should have a successively higher (or lower proportion of dopant included, depending on whether the dopant segregates to the crystal or to the melt, i.e. on whether the dopant has a segregation coefficient greater or less than unity). The present invention, by providing non-uniformly doped initial feedstock to the melt, provides a convenient way to accomplish uniform doping of the final crystals pulled. Whatever the magnitude of the segregation coefficient, the segments of the polysilicon rods pulled should be used as feedstock in the same order in which they were pulled, i.e. the segment nearest the seeded end is used as the first recharge rod. Thus, doping uniformity comparable to that realized by zone levelling is achieved in crystals grown from graded recharge rods, as taught by the present invention.

Since the rods pulled, according to this embodiment of the present invention, from the intermediate-stage puller are typically unstressed high-crystallite size polysilicon with a significant concentration of nitrogen, these rods are mechanically strong and can be manipulated safely (by hand or mechanically), unlike the stressed rods produced by the unmodified Siemens process.

Since the silicon nitride matrix is wetted by molten silicon, and the solubility of nitrogen in silicon is limited, the nitride matrix is expected to survive as a substrate for the liquid silicon over long periods of time. The physical capability of heating the entire exposed silicon nitride matrix and vessel to temperatures above 1400° C. also can be used for the reaction bonding of nitridation of silicon parts in situ and for the CVD coating of the reactor (e.g. in the case of inadvertent contamination of the reactor). Addition of an appropriate amount of nitrogen gas to the trichlorosilane and hydrogen feedstock helps to limit the dissolution of the silicon nitride structure by the high temperature silicon flow. Solid silicon rods which are saturated with nitrogen at the $5 \times 10^{15}$ atoms per cc level and depleted of all other atoms approaching the parts per billion level result from this process.

Liquid transfer to a puller for the intermediate rod crystallization and purification process is a major innovation which conserves energy, and forms the most desirable product for input to the present generation of crystal pullers. Monocrystalline rather than polycrystalline silicon can be grown at this position in the process for additional purity, in which case multiple liquid transfer stations are preferably used. That is, the volume rate of silicon produced by a single nitride matrix 6 of reasonable size may be several times the volume rate of silicon pulled in a high-quality crystal by a conventional puller, and therefore, to use the full capacity of the matrix 6, several different valves 12 are optionally used to provide molten silicon to several different intermediate pullers 14. After growth of the rod has produced a sufficiently high concentration of impurities in the crucible the thermal valve on the crucible can be opened to discharge the melt residue. Refilling of the crucible through the liquid transfer system (also fabricated from silicon nitride) provides for the continuous withdrawal of melt from the reactor.

Thus, the present invention provides the advantage of a process for formation of semiconductor-grade bulk silicon, wherein highly pure silicon is produced.

The present invention provides the further advantage that formation of bulk silicon can proceed directly to a solid chunk of polycrystalline or monocrystalline silicon, without intermediate stages having a large surface area to absorb impurities.

The present invention provides the further advantage that a very small throughput plant for the manufacture of semiconductor-grade silicon can be economically configured.

The present invention provides the further advantage that the rather expensive highly purified input gas (trichlorosilane or other) is used very efficiently.

The present invention provides the further advantage that it is not necessary to recycle the bulk material produced to provide a seed input for the preceding stage.

It will be apparent to those skilled in the art that a large number of modifications and variations may be used in practicing the method of the present invention, which is not limited except that explicitly set forth in the appended claims.

What is claimed is:

1. A process for producing silicon from a silicon bearing gas flow, comprising the steps of:
    providing a matrix of silicon nitride particles;
    forcing through a portion of said matrix of silicon nitride particles a stream of a silicon bearing gas mixture;
    said matrix of silicon nitride particles being heated to above the melting temperature of silicon while said gas flow is forced through said matrix; and
    collecting, at the bottom of said matrix of silicon nitride particles, liquid silicon which was deposited on said matrix of silicon nitride particles from said gas stream.

2. The process of claim 1, wherein said gas flow comprises trichlorosilane and hydrogen.

3. The process of claim 1, wherein said matrix is held at a temperature less than 50° C. above the melting point of silicon.

4. The process of claim 1, wherein said matrix of silicon nitride particles is contained in a reactor comprising silicon nitride.

5. The process of claim 4, wherein all of said reactor consists essentially of silicon nitride.

6. The process of claim 1, wherein said gas mixture further comprises a substantial percentage of an oxygen-bearing gas.

7. The process of claim 6, wherein said oxygen-bearing gas is nitrous oxide.

8. The process of claim 1, further comprising the step of:
    transporting said collected liquid silicon in the liquid state to an intermediate melt reservoir; and
    growing a rod of silicon from said melt reservoir.

9. The process of claim 8, further comprising the subsequent step of:
    incorporating said silicon rod into a final melt of silicon, and pulling a single large crystal of silicon from said final melt.

10. The process of claim 8, further comprising the step of:
    introducing a dopant impurity to said intermediate melt reservoir, prior to pulling said silicon rod from said intermediate melt reservoir.

11. The process of claim 8, wherein said step of transporting said liquid silicon to said intermediate melt reservoir comprises channeling said liquid silicon through piping comprising silicon nitride.

12. The process of claim 11, wherein said silicon rod is polycrystalline.

13. The process of claim 8, wherein said rod comprises substantially monocrystalline silicon.

14. The process of claim 13, further comprising an additional intermediate melt reservoir, said liquid silicon being selectively provided from said collection at the bottom of said matrix to alternate ones of said intermediate melt reservoirs;
    silicon-freezing valves being interposed between said collection point and each said intermediate melt reservoir.

* * * * *